United States Patent
Araki et al.

(10) Patent No.: US 9,935,477 B2
(45) Date of Patent: Apr. 3, 2018

(54) CHARGE/DISCHARGE CONTROL METHOD AND CHARGE/DISCHARGE CONTROL APPARATUS FOR LITHIUM ION BATTERY

(71) Applicant: HITACHI, LTD., Tokyo (JP)

(72) Inventors: Chieko Araki, Tokyo (JP); Hirofumi Takahashi, Tokyo (JP); Masahiro Yonemoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 104 days.

(21) Appl. No.: 14/909,278

(22) PCT Filed: Aug. 22, 2013

(86) PCT No.: PCT/JP2013/072410
§ 371 (c)(1),
(2) Date: Feb. 1, 2016

(87) PCT Pub. No.: WO2015/025402
PCT Pub. Date: Feb. 26, 2015

(65) Prior Publication Data
US 2016/0181833 A1  Jun. 23, 2016

(51) Int. Cl.
*H02J 7/00* (2006.01)
*H01M 10/44* (2006.01)
*H01M 10/48* (2006.01)
*H01M 10/0525* (2010.01)
*G01R 31/36* (2006.01)

(52) U.S. Cl.
CPC .......... *H02J 7/007* (2013.01); *G01R 31/3606* (2013.01); *H01M 10/0525* (2013.01); *H01M 10/44* (2013.01); *H01M 10/48* (2013.01)

(58) Field of Classification Search
CPC .............. H02J 7/0031; H02J 2007/004; H02J 2007/0037; Y02E 60/12; H01M 10/48
USPC ........................................................ 320/134
See application file for complete search history.

(56) References Cited

U.S. PATENT DOCUMENTS

| | | | |
|---|---|---|---|
| 2010/0045236 A1* | 2/2010 | Muraoka | H01M 10/0525 320/118 |
| 2012/0176092 A1* | 7/2012 | Fujii | G01R 31/361 320/134 |

FOREIGN PATENT DOCUMENTS

| | | |
|---|---|---|
| JP | 09-120843 A | 5/1997 |
| JP | 2012-253975 A | 12/2012 |
| JP | 2013-033692 A | 2/2013 |

* cited by examiner

*Primary Examiner* — Arun Williams
(74) *Attorney, Agent, or Firm* — Volpe and Koenig, P.C.

(57) ABSTRACT

In a charge/discharge control method of a lithium ion battery having a negative electrode active material and connected to a charge/discharge control device, battery information regarding a charge/discharge state of the lithium ion battery is acquired by the charge/discharge control device, a degradation state of the lithium ion battery is determined on the basis of the battery information, by the charge/discharge control device, and a voltage range for charge/discharge of the lithium ion battery is changed on the basis of a determination result of the degradation state, by the charge/discharge control device.

2 Claims, 12 Drawing Sheets

| | NUMBER OF TIMES OF CHANGING VOLTAGE RANGE | TEST END CYCLE NUMBER | INTEGRATION CAPACITY RATIO |
|---|---|---|---|
| FIRST EXAMPLE | 2 | 5000 | 1.1 |
| SECOND EXAMPLE | 1 | 4500 | 1.1 |
| FIRST COMPARATIVE | 0 | 4000 | 1 |

Fig. 12

FIRST EXAMPLE

| CYCLE NUMBER | CAPACITY RETENTION RATE | VOLTAGE RANGE CHANGE | CHARGE UPPER LIMIT VOLTAGE (V) | DISCHARGE LOWER LIMIT VOLTAGE (V) |
|---|---|---|---|---|
| 0 | 1 | | 3.9 | 3.4 |
| 1000 | 0.94 | | 3.95 | 3.3 |
| 2000 | 0.91 | ○ | 3.95 (BEFORE CHANGE) 3.9 (AFTER CHANGE) | 3.2 (BEFORE CHANGE) 3.3 (AFTER CHANGE) |
| 3000 | 0.87 | | 3.95 | 3.4 |
| 4000 | 0.84 | ○ | 4 (BEFORE CHANGE) 3.9 (AFTER CHANGE) | 3.2 (BEFORE CHANGE) 3.4 (AFTER CHANGE) |
| 5000 | 0.8 | | 3.95 | 3.3 |

Fig. 13

SECOND EXAMPLE

| CYCLE NUMBER | CAPACITY RETENTION | VOLTAGE RANGE CHANGE | CHARGE UPPER LIMIT VOLTAGE (V) | DISCHARGE LOWER LIMIT VOLTAGE (V) |
|---|---|---|---|---|
| 0 | 1 | | 3.9 | 3.4 |
| 1000 | 0.94 | | 3.95 | 3.3 |
| 2000 | 0.91 | | 3.98 | 3.25 |
| 3000 | 0.85 | ○ | 4.0 (BEFORE CHANGE) 3.9 (AFTER CHANGE) | 3.2 (BEFORE CHANGE) 3.4 (AFTER CHANGE) |
| 4000 | 0.83 | | 3.95 | 3.4 |
| 4500 | 0.8 | | 3.95 | 3.3 |

Fig. 14

FIRST COMPARATIVE EXAMPLE

| CYCLE NUMBER | CAPACITY RETENTION RATE | VOLTAGE RANGE CHANGE | CHARGE UPPER LIMIT VOLTAGE (V) | DISCHARGE LOWER LIMIT VOLTAGE (V) |
|---|---|---|---|---|
| 0 | 1 | | 3.9 | 3.4 |
| 1000 | 0.94 | | 3.95 | 3.3 |
| 2000 | 0.91 | | 3.98 | 3.25 |
| 3000 | 0.85 | | 4.03 | 3.2 |
| 4000 | 0.8 | | 4.08 | 3.15 |

CHARGE/DISCHARGE CONTROL METHOD AND CHARGE/DISCHARGE CONTROL APPARATUS FOR LITHIUM ION BATTERY

TECHNICAL FIELD

The present invention relates to a charge/discharge control method and a charge/discharge control device of a lithium ion battery.

BACKGROUND ART

Recently, hybrid vehicles using engines and motors together as power sources and electric vehicles using only the motors as the power sources without having the engines are developed and manufactured, from the viewpoint of environmental protection and energy saving. Secondary batteries that can charge/discharge electricity repetitively are used as power supplies (energy sources) of the hybrid vehicles and the electric vehicles and become essential components. Above all, a lithium ion battery is a secondary battery of a high energy density in which an operation voltage is high and a high output is easily obtained. For this reason, recently, the lithium ion battery becomes important increasingly as the power supply of the hybrid vehicle or the electric vehicle.

Conventionally, technology for using an active material of a large capacity to realize the high output and the high energy density in the lithium ion battery is known. However, an active material such as silicon and SiO known generally as the active material of the large capacity is greatly expanded/contracted at the time of charge/discharge. For this reason, if the charge/discharge is repeated in a battery using the active material, degradation is likely to occur due to collapse and isolation of the active material and a cycle characteristic is bad.

As technology for resolving the above problem, technology for suppressing degradation of the active material by using a binder having high coatability for an electrode material and high adhesion is disclosed in PTL 1.

CITATION LIST

Patent Literature

PTL 1: Japanese Unexamined Patent Publication No. 2013-33692

SUMMARY OF INVENTION

Technical Problem

According to PTL 1, the degradation of the active material is suppressed by devising a material of the binder, so that deterioration of the cycle characteristic of the lithium ion battery is prevented. However, even though the binder is used, it is difficult to completely suppress the degradation of the active material. For this reason, the cycle characteristic cannot be effectively improved.

Solution to Problem

A charge/discharge control method of a lithium ion battery according to the present invention is a charge/discharge control method of a lithium ion battery having a negative electrode active material and connected to a charge/discharge control device. In the charge/discharge control method, battery information regarding a charge/discharge state of the lithium ion battery is acquired by the charge/discharge control device, a degradation state of the lithium ion battery is determined on the basis of the battery information, by the charge/discharge control device, and a voltage range for charge/discharge of the lithium ion battery is changed on the basis of a determination result of the degradation state, by the charge/discharge control device.

A charge/discharge control device according to the present invention controls charge/discharge of a lithium ion battery having a negative electrode active material. The charge/discharge control device includes a battery information acquisition unit which acquires battery information regarding a charge/discharge state of the lithium ion battery, a degradation state determination unit which determines a degradation state of the lithium ion battery, on the basis of the battery information acquired by the battery information acquisition unit, and a voltage range change unit which changes a voltage range for the charge/discharge of the lithium ion battery, on the basis of a determination result of the degradation state by the degradation state determination unit.

Advantageous Effects of Invention

According to the invention, a cycle characteristic of a lithium ion battery can be effectively improved.

BRIEF DESCRIPTION OF DRAWINGS

FIG. 12 is a table illustrating the details of a cycle test result according to a first example.

FIG. 13 is a table illustrating the details of a cycle test result according to a second example.

FIG. 14 is a table illustrating the details of a cycle test result according to a first comparative example.

DESCRIPTION OF EMBODIMENTS (Configuration of Charge/Discharge Control Device)

Figure 1:
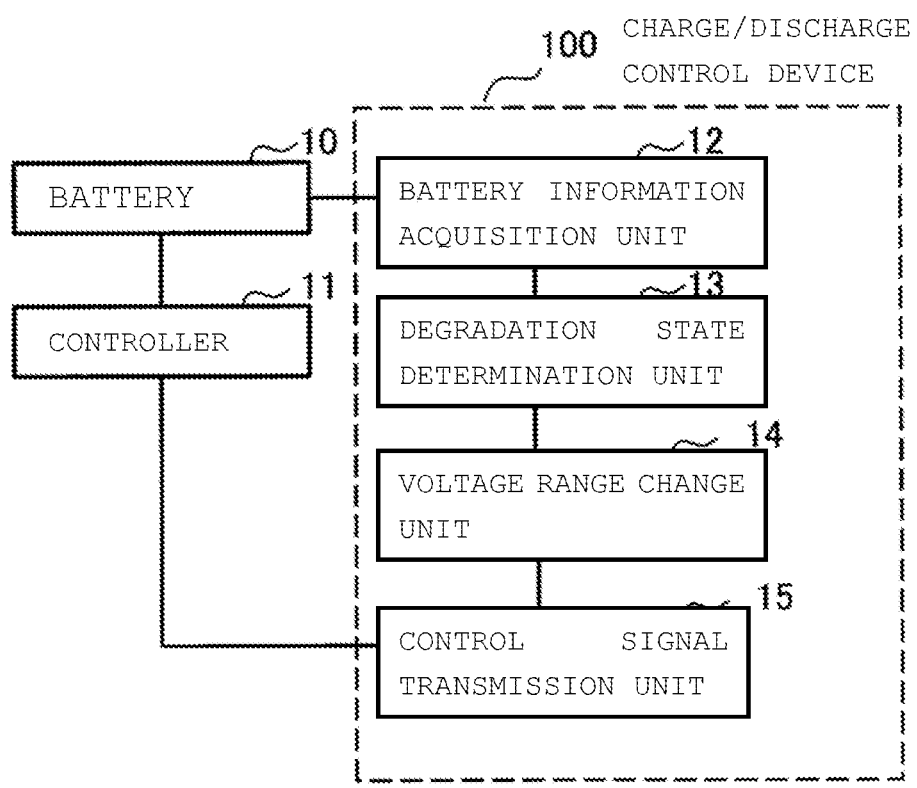
FIG. 1 is a block diagram illustrating a configuration of a charge/discharge control device according to an embodiment of the present invention.

FIG. 1 is a block diagram illustrating a configuration of a charge/discharge control device 100 according to an embodiment of the present invention. The charge/discharge control device 100 illustrated in FIG. 1 is a device to control charge/discharge of a lithium ion battery 10 (hereinafter, simply referred to as the battery 10) to be a secondary battery and functionally has a battery information acquisition unit 12, a degradation state determination unit 13, a voltage range change unit 14, and a control signal transmission unit 15. The charge/discharge control device 100 is connected to the battery 10 and a controller 11.

The battery information acquisition unit 12 acquires information, such as an inter-terminal voltage (closed circuit voltage) of the battery 10 during the charge/discharge, a current flowing to the battery 10, and a charge/discharge time of the battery 10, as battery information regarding a charge/discharge state of the battery 10. The battery information acquisition unit 12 can acquire the battery information using a voltmeter, an ammeter, and a timer, for example. The battery information acquisition unit 12 outputs each acquired battery information to the degradation state determination unit 13.

The degradation state determination unit 13 determines a degradation state, that is, a degradation degree of the battery 10, on the basis of each battery information acquired by the battery information acquisition unit 12. A method of determining the degradation state of the battery 10 by the degradation state determination unit 13 will be described in detail later. If the degradation state determination unit 13 determines the degradation state of the battery 10, the degradation state determination unit 13 outputs a determination result thereof to the voltage range change unit 14.

The voltage range change unit 14 changes a voltage range for the charge/discharge of the battery 10, on the basis of the determination result of the degradation state of the battery 10 by the degradation state determination unit 13. That is, values to reset an upper limit voltage (charge upper limit voltage) of the battery 10 at the time of the charge and a lower limit voltage (discharge lower limit voltage) of the battery 10 at the time of the discharge, preset in the controller 11, according to the degradation state of the battery 10, are calculated. A method of changing the voltage range by the voltage range change unit 14 will be described in detail later. If the voltage range change unit 14 calculates the resetting value of the charge upper limit voltage and the resetting value of the discharge lower limit voltage, the voltage range change unit 14 outputs the resetting values as information showing a voltage range after the change to the control signal transmission unit 15.

If the voltage range for the charge/discharge of the battery 10 is changed by the voltage range change unit 14, the control signal transmission unit 15 transmits a control signal to command the voltage range after the change to the controller 11. That is, control signals showing the resetting value of the charge upper limit voltage and the resetting value of the discharge lower limit voltage are generated and are outputted to the controller 11.

The charge/discharge control device 100 can execute charge/discharge control of the battery 10 using the controller 11, by each configuration described above.

The controller 11 controls an energization state of the battery 10 during the charge/discharge, such that the charge/discharge of the battery 10 is performed in ranges of the preset voltage and current. If the control signals are transmitted from the control signal transmission unit 15 of the charge/discharge control device 100 as described above, the controller 11 receives the control signals and changes the voltage range for the charge/discharge of the battery 10, on the basis of the received control signals. In addition, energization to the battery 10 is performed according to the voltage range after the change.

The charge/discharge control device 100 can realize the individual components illustrated in FIG. 1, using a CPU, a ROM, a RAM, and an HDD, for example. That is, a process according to a predetermined program recorded on the ROM or the HDD is executed by the CPU using the RAM, so that individual functions of the battery information acquisition unit 12, the degradation state determination unit 13, the voltage range change unit 14, and the control signal transmission unit 15 can be realized in the charge/discharge control device 100.

(Method of Determining Degradation State and Method of Changing Voltage Range)

Next, a method of determining a degradation state of the battery 10 by the degradation state determination unit 13 and a method of changing the voltage range for the charge/discharge of the battery 10 by the voltage range change unit 14 will be described.

To determine the degradation state of the battery 10, first, the degradation state determination unit 13 calculates a discharge capacity Q of the battery 10, that is, a total value of an amount of electricity discharged from the battery 10 at the time of the discharge, for every predetermined time, on the basis of a voltage, a current, and a charge/discharge time of the battery 10 shown by the battery information from the battery information acquisition unit 12. Specifically, a measurement value of a current obtained during the discharge of the battery 10 is integrated for every predetermined time, so that the discharge capacity Q can be calculated.

In this way, if the discharge capacity Q is calculated, the degradation state determination unit 13 calculates dV/dQ showing a ratio of a change amount dQ of the discharge capacity Q and a change amount dV of a battery voltage V, for every predetermined time. Specifically, the change amount dQ of the discharge capacity Q and the change amount dV of the battery voltage V for every predetermined time are calculated from a calculation result of the discharge capacity Q obtained for every predetermined time and individual measurement values of a voltage and a current at that time, so that dV/dQ can be calculated on the basis of a calculation result.

If the discharge capacity Q and dV/dQ of the battery 10 are calculated for every predetermined time as described above, the degradation state determination unit 13 calculates a Q-dV/dQ curve showing a relation of the discharge capacity Q and dV/dQ, on the basis of a calculation result. Specifically, the Q-dV/dQ curve can be calculated by setting a horizontal axis to show a value of the discharge capacity Q, setting a vertical axis to show a value of dV/dQ, and graphically showing values calculated for every predetermined time.

Figure 2:
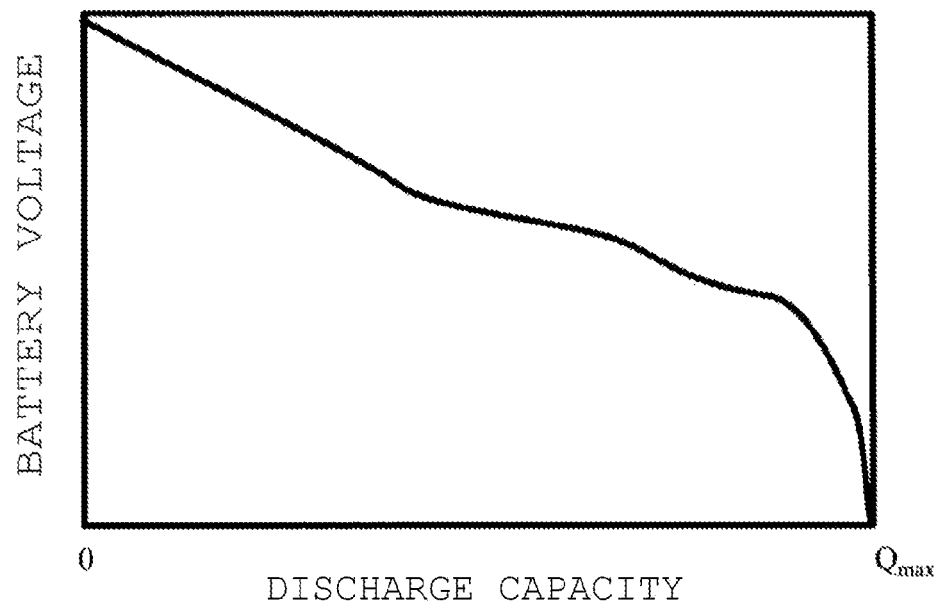
FIG. 2 is a diagram illustrating an example of a discharge curve showing a relation of a discharge capacity Q and a measurement result of a battery voltage V corresponding to the discharge capacity.

FIG. 2 is a diagram illustrating an example of a discharge curve showing a relation of the discharge capacity Q calculated by the degradation state determination unit 13 and a measurement result of the battery voltage V corresponding to the discharge capacity. The discharge curve shows an aspect of a change of the battery voltage V when the battery 10 is discharged from a full charge state (discharge capacity 0) to a perfect discharge state (maximum discharge capacity Qmax) in which the discharge is disabled. From FIG. 2, it is seen that, when the battery 10 is discharged and the discharge capacity Q increases, the battery voltage V decreases.

Figure 3:
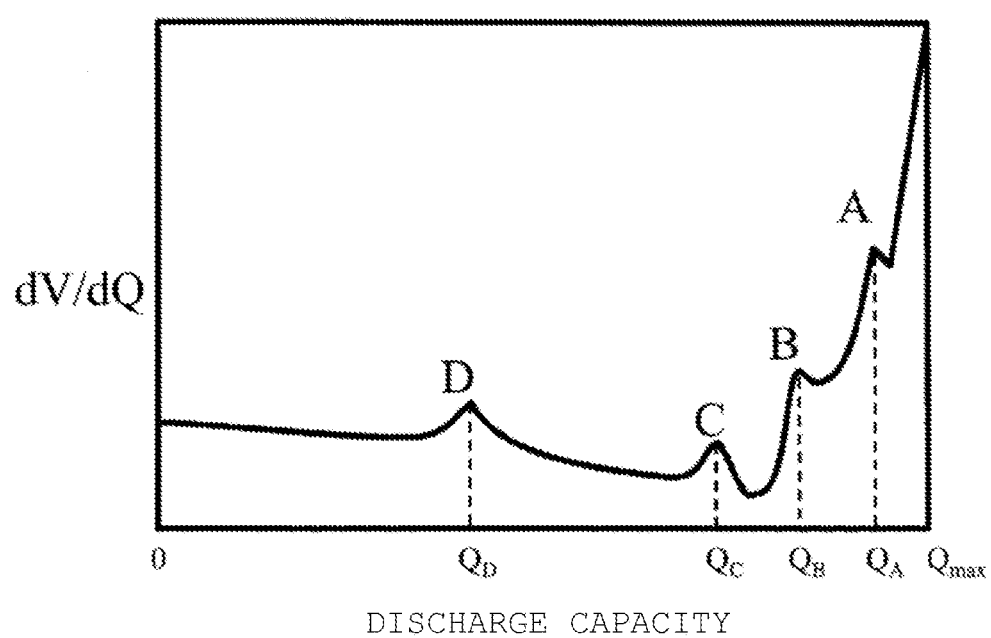
FIG. 3 is a diagram illustrating an example of a Q-dV/dQ curve.

FIG. 3 is a diagram illustrating an example of the Q-dV/dQ curve calculated by the degradation state determination unit 13. The Q-dV/dQ curve illustrates an example of a relation of the discharge capacity Q and dV/dQ when the battery 10 is discharged from the full charge state (discharge capacity 0) to the perfect discharge state (maximum discharge capacity Qmax).

In the Q-dV/dQ curve of FIG. 3, four characteristic singular points (peak points) shown by A, B, C, and D appear at individual positions of discharge capacities $Q_A$, $Q_B$, $Q_C$, and $Q_D$. The positions of the singular points and the number thereof are determined according to kinds of an electrode material and an active material of the battery 10. For example, when SiO (silicon oxide) is used as a negative electrode active material and a material obtained by mixing SiO with graphite is used for a negative electrode of the battery 10, the Q-dV/dQ curve illustrated in FIG. 2 can be obtained. In this case, the singular points B, C, and D show that the graphite to be the negative electrode material contributes to a discharge reaction in the negative electrode and the singular point A shows that SiO to be the negative electrode active material contributes to the discharge reaction in the negative electrode. That is, in a range of the discharge capacity Q equal to or smaller than $Q_B$, lithium ions are discharged from the graphite and in a range of the discharge capacity Q larger than $Q_B$, the lithium ions are discharged from SiO.

If the Q-dV/dQ curve illustrated in FIG. 3 is calculated, the degradation state determination unit 13 determines the degradation state of the battery 10 on the basis of the Q-dV/dQ curve, as follows.

Figure 4:
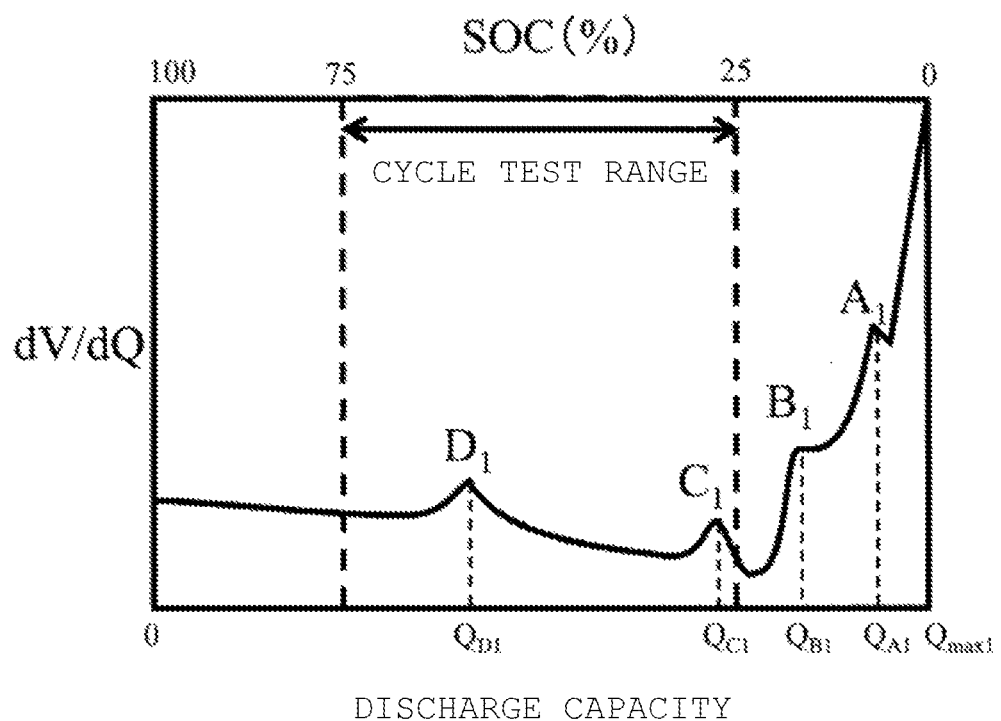
FIG. 4 is a diagram illustrating an example of a Q-dV/dQ curve calculated before degradation of a battery and a cycle test range.

FIG. 4 is a diagram illustrating an example of a Q-dV/dQ curve calculated before the degradation of the battery 10 and a cycle test range. In FIG. 4, an example of the Q-dV/dQ curve calculated in a state before the degradation of the battery 10 when a range of a state of charge (SOC) of the battery 10 to be 25% to 75% is set as the cycle test range and the charge/discharge of the battery 10 is continuously repeated in the range is illustrated. In the Q-dV/dQ curve of FIG. 4, singular points $A_1$, $B_1$, $C_1$, and $D_1$ before the degradation appearing at individual positions of discharge capacities $Q_{A1}$, $Q_{B1}$, $Q_{C1}$, and $Q_{D1}$ correspond to the singular points A, B, C, and D of FIG. 3. In addition, a maximum discharge capacity Qmax1 when the SOC is 0% corresponds to the maximum discharge capacity Qmax in the perfect discharge state of FIG. 3. During the charge/discharge of the battery 10, only a Q-dV/dQ curve of a portion corresponding to the cycle test range in the drawing is calculated in the degradation state determination unit 13.

Figure 5:
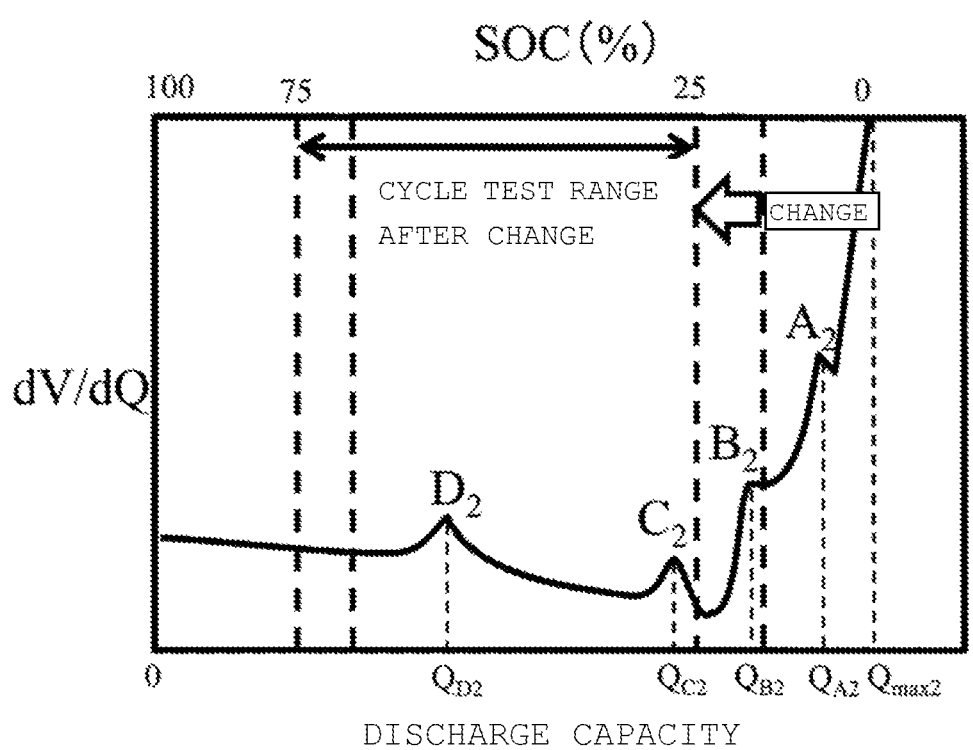
FIG. 5 is a diagram illustrating a change example of a Q-dV/dQ curve calculated in a state in which a battery is degraded and a cycle test range.

FIG. 5 is a diagram illustrating a change example of a Q-dV/dQ curve calculated in a state in which the battery 10 is degraded and a cycle test range. If the charge/discharge is repeated and the battery 10 is degraded, the Q-dV/dQ curve calculated changes according to the degradation and a position of each singular point moves gradually in a leftward direction of the drawing. As a result, as illustrated in FIG. 5, a singular point $B_2$ after the degradation may be included in the cycle test range before the change. In FIG. 5, singular points $A_2$, $B_2$, $C_2$, and $D_2$ after the degradation appearing at individual positions of discharge capacities $Q_{A2}$, $Q_{B2}$, $Q_{C2}$, and $Q_{D2}$ correspond to the singular points $A_1$, $B_1$, $C_1$, and $D_1$ before the degradation illustrated in FIG. 4. In addition, a maximum discharge capacity Qmax2 after the degradation corresponds to the maximum discharge capacity Qmax1 before the degradation illustrated in FIG. 4 and shows the same value of dV/dQ.

In the above state, if the charge/discharge of the battery 10 is repeated without changing the cycle test range, SiO to be the negative electrode active material contributes to the charge/discharge reaction in the negative electrode, so that SiO is degraded, and the degradation of the battery 10 is accelerated.

Therefore, when the Q-dV/dQ curve illustrated in FIG. 5 is calculated, the degradation state determination unit 13 determines that SiO to be the negative electrode active material contributes to the charge/discharge reaction in the negative electrode in the battery 10 and determines that the battery 10 is in a degradation state. A determination result is output from the degradation state determination unit 13 to the voltage range change unit 14. As a result, a warning showing that the battery 10 is in the degradation state and it is necessary to change a voltage range for the charge/discharge of the battery 10 is output from the degradation state determination unit 13 to the voltage range change unit 14.

In the degradation state determination unit 13, the degradation state of the battery 10 can be determined by the method described above.

If the voltage range change unit 14 receives the determination result showing that the battery 10 is in the degradation state, from the degradation state determination unit 13, the voltage range change unit 14 executes recalculation of the SOC, on the basis of the Q-dV/dQ curve of FIG. 5. Specifically, as illustrated in FIG. 5, a relation of the discharge capacity Q and the SOC is recalculated such that the SOC becomes 0% at the maximum discharge capacity Qmax2 after the degradation. A range of 25% to 75% is specified in the SOC after the change, on the basis of a result of the recalculation of the SOC, so that the cycle test range can be changed.

If the recalculation of the SOC is executed as described above and the cycle test range is changed on the basis of the result thereof, the voltage range change unit 14 calculates resetting values of a charge upper limit voltage and a discharge lower limit voltage for the battery 10, according to the cycle test range after the change. Specifically, a relation of the SOC and the battery voltage V in the battery 10 after the degradation is calculated on the basis of battery information acquired by the battery information acquisition unit 12 when the Q-dV/dQ curve of FIG. 5 is calculated. The individual battery voltages V when the SOC is 75% and 25% are calculated on the basis of the relation, so that the resetting values of the charge upper limit voltage and the discharge lower limit voltage can be calculated.

In the voltage range change unit 14, the voltage range for the charge/discharge of the battery 10 can be changed by the method described above. A relation of a discharge capacity and a voltage and a Q-dV/dQ curve of the positive electrode and the negative electrode may be calculated by a method disclosed in Japanese Unexamined Patent Publication No. 2009-80093, for example, and the degradation state of the battery 10 may be determined using the Q-dV/dQ curve of the positive electrode and the negative electrode.

(Charge/Discharge Control Process)

Figure 6:
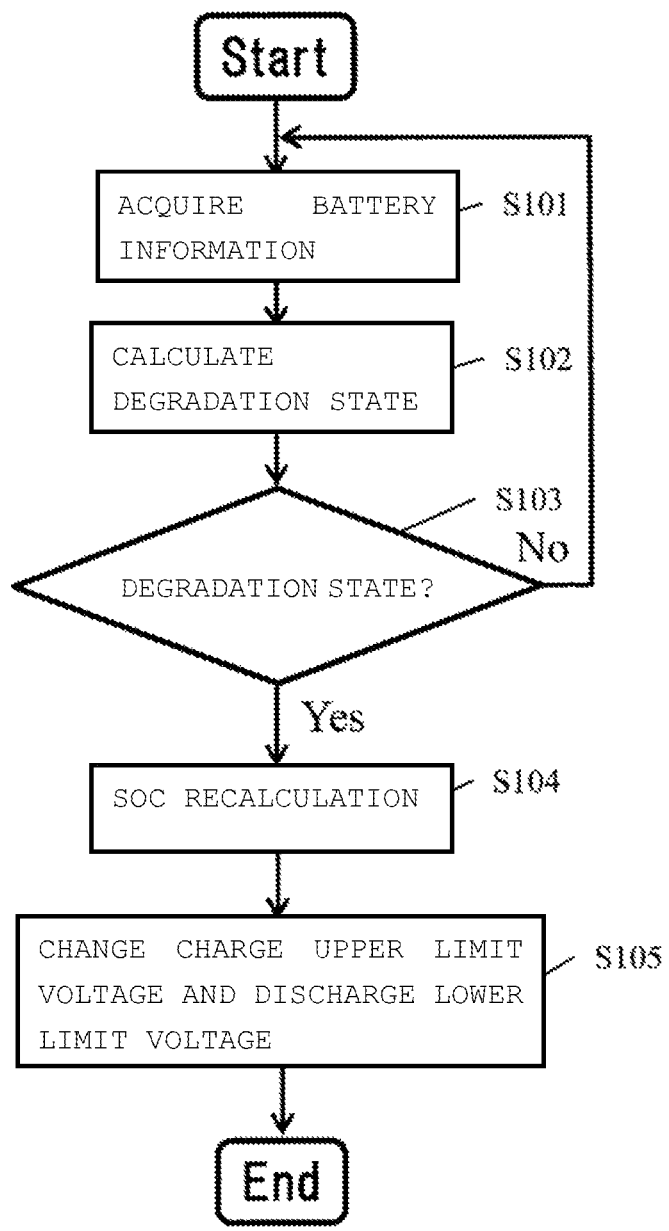
FIG. 6 is a flowchart of a charge/discharge control process executed by a charge/discharge control device.

Next, a charge/discharge control process executed by the charge/discharge control device 100 when charge/discharge control of the battery 10 is executed will be described. FIG. 6 is a flowchart of the charge/discharge control process executed by the charge/discharge control device 100.

In step S101, the charge/discharge control device 100 acquires battery information regarding a charge/discharge state of the battery 10, by the battery information acquisition unit 12. Here, as described above, the inter-terminal voltage, the current, and the charge/discharge time of the battery 10 are acquired as the battery information. The battery information acquisition unit 12 transmits the acquired battery information to the degradation state determination unit 13.

In step S102, the charge/discharge control device 100 calculates the degradation state of the battery 10, by the degradation state determination unit 13, on the basis of the battery information acquired by step S101. Here, the Q-dV/dQ curve is calculated from the battery information by the method described above, so that the degradation state of the battery 10 is calculated.

In step S103, the charge/discharge control device 100 determines whether the battery 10 is in the degradation state, by the degradation state determination unit 13, on the basis of the Q-dV/dQ curve acquired by the calculation of the degradation state of step S102. Here, as described in FIG. 5, it is determined whether the specific singular point (singular point B2 of FIG. 5) showing that SiO to be the negative electrode active material contributes to the charge/discharge reaction in the negative electrode has been detected in the charge/discharge range of the battery 10 in the Q-dV/dQ curve, so that it is determined whether the battery 10 is in the degradation state. As a result, when it is determined that the battery is in the degradation state, a determination result thereof is transmitted from the degradation state determination unit 13 to the voltage range change unit 14, the warning for the change of the voltage range is output, and the process proceeds to step S104. Meanwhile, when it is determined that the battery is not in the degradation state, the process returns to step S101. In this case, after a predetermined waiting time, the processes of steps S101 to S103 are executed again.

The condition to determine that the battery 10 is in the degradation state in step S103 may be set as other condition. For example, in the Q-dV/dQ curve illustrated in FIG. 5, when an intermediate point of the discharge capacities $Q_{A2}$ and $Q_{B2}$ corresponding to the singular points $A_2$ and $B_2$ is taken and the intermediate point is included in the charge/discharge range of the battery 10, it is determined that the battery 10 is in the degradation state. Even in this case, it has been confirmed that the degradation of SiO to be the negative electrode active material does not progress as much and the degradation of the battery 10 is suppressed. In addition, it can be determined whether the battery 10 is in the degradation state, using various conditions, on the basis of the Q-dV/dQ curve calculated by step S102.

In step S104, the charge/discharge control device 100 executes the recalculation of the SOC, by the voltage range change unit 14, on the basis of the determination result of the degradation state of step S103. Here, as described in FIG. 5, the relation of the discharge capacity Q and the SOC is recalculated according to the degradation state of the battery 10, using the Q-dV/dQ curve calculated by step S102.

In step S105, the charge/discharge control device 100 changes the charge upper limit voltage and the discharge lower limit voltage for the battery 10, by the voltage range change unit 14, on the basis of the result of the recalculation of the SOC of step S104. Here, the range of the charge/discharge voltage of the battery 10 is reset according to the relation of the discharge capacity Q and the SOC recalculated by step S104 and the resetting values of the charge upper limit voltage and the discharge lower limit voltage are calculated according to the range. At this time, only any one of the charge upper limit voltage and the discharge lower limit voltage may be changed. The voltage range change unit 14 transmits the calculated resetting values to the control signal transmission unit 15. As a result, control signals according to the charge upper limit voltage and the discharge lower limit voltage after the change are transmitted from the control signal transmission unit 15 to the controller 11 and the range of the charge/discharge voltage of the battery 10 is changed.

If step S105 is executed, the charge/discharge control device 100 ends the charge/discharge control process of FIG. 6. In addition, the charge/discharge control process of FIG. 6 is executed again from step S101, after the predetermined waiting time.

When the voltage range change unit 14 receives the warning output from the degradation state determination unit 13 by step S103, the voltage range change unit 14 may cause a user to select whether or not to change the range of the charge/discharge voltage of the battery 10. In this case, when the user selects change of the range of the charge/discharge voltage, the processes of steps S104 and S105 are executed in the voltage range change unit 14. Meanwhile, when the user does not the change of the range of the charge/discharge voltage, the charge/discharge control process of FIG. 6 ends without executing the processes of steps S104 and S105 in the voltage range change unit 14.

Here, the change of the charge upper limit voltage will be described. The lithium ion battery is normally used in the range of the SOC of about 25% to 75%. However, the SOC is a value defined by the user and cannot be actually measured. For this reason, in normal control of the battery 10 by the controller 11, the charge/discharge of the battery 10 is controlled on the basis of the preset charge/discharge curve, such that the upper limit value and the lower limit value of the battery voltage V during the charge/discharge become values corresponding to the used SOC range of the battery 10, for example, the SOC range of 25% to 75%. Specifically, when the battery 10 is used in the SOC range of 25% to 75%, the discharge lower limit voltage is a voltage corresponding to SOC=25% and the charge upper limit voltage is a voltage corresponding to SOC=75%.

As described above, if the battery 10 is degraded, voltages corresponding to SOC values change (increase) even though the SOC values are the same. For this reason, if the charge/discharge of the battery 10 is performed with the same charge upper limit voltage and discharge lower limit voltage as the charge upper limit voltage and the discharge lower limit voltage before the degradation though the battery 10 is degraded, the actual degradation state of the battery 10 is not considered at all. For this reason, the life of the battery 10 may be shortened. In addition, the charge/discharge capability of the battery 10 cannot be sufficiently utilized.

Therefore, in this embodiment, the charge upper limit voltage and the discharge lower limit voltage are changed according to the degradation state of the battery 10, by the charge/discharge control device 100. This point will be described specifically below with reference to FIG. 7.

Figure 7:
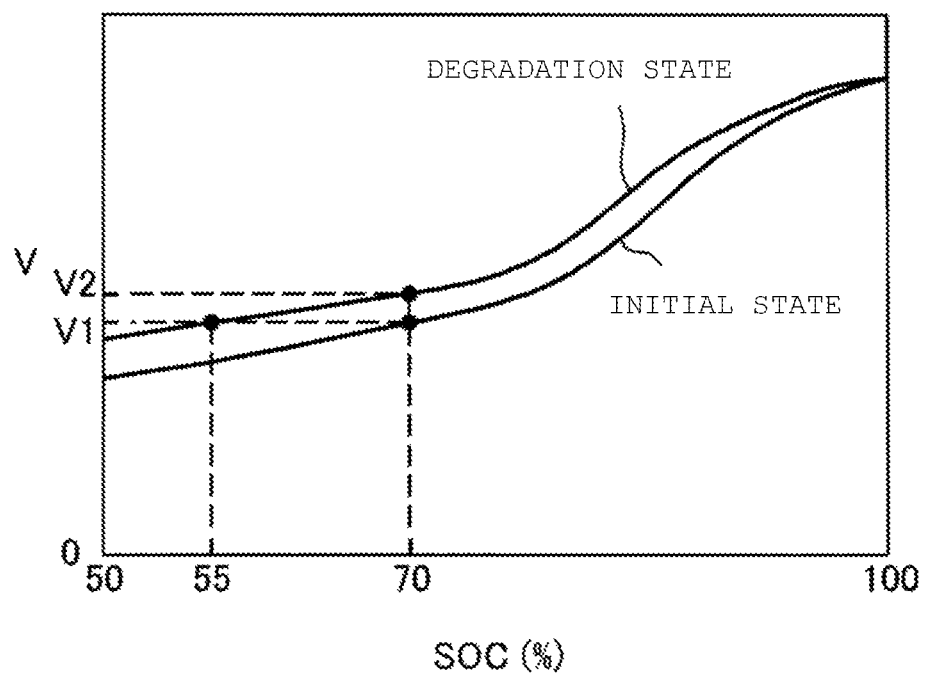
FIG. 7 is a diagram illustrating an example of a charge/discharge curve corresponding to a battery of an initial state and a charge/discharge curve corresponding to a battery of a degradation state.

FIG. 7 is a diagram illustrating an example of a charge/discharge curve corresponding to the battery 10 of the initial state and a charge/discharge curve corresponding to the battery 10 of the degradation state. In FIG. 7, portions corresponding to SOC=50% to 100% are enlarged and individual charge/discharge curves are illustrated.

In the initial state in which the battery 10 is not degraded, as illustrated in FIG. 7, a value of the battery voltage V corresponding to SOC=70% is V1. Therefore, the charge upper limit voltage is set as V1, so that the charge can be performed until the SOC becomes 70%. Meanwhile, when the battery 10 is degraded and enters the degradation state, as illustrated in FIG. 7, the value of the battery voltage V corresponding to SOC=70% increases from V1 to V2. For this reason, if the charge is performed with the charge upper limit voltage as V1, according to the charge/discharge curve of the initial state, without considering the degradation state of the battery 10, the SOC increases to only 55%, not 70%. That is, the charge ends though there still remains a margin in the capacity of the battery 10.

Therefore, the charge upper limit voltage is changed according to the degradation state of the battery 10, by the charge/discharge control device 100, to avoid such a situation. That is, when the battery 10 is degraded, the charge upper limit voltage changes from V1 to V2 according to the degradation. At this time, it is not necessary to change the charge upper limit voltage to V2 and the charge upper limit voltage may be changed to approximate to V2. In this way, even though the battery 10 is degraded, the charge does not end when the SOC is 55% and the charge can be performed until the SOC becomes about 70%, similar to the initial state. Therefore, even though the battery 10 is degraded, a decrease of the capacity of the battery 10 to be usable can be avoided.

In the above description, the change of the charge upper limit voltage has been described. This is the same in the change of the discharge lower limit voltage. That is, the discharge lower limit voltage is changed according to the degradation state of the battery 10, so that the decrease of the capacity of the battery 10 to be usable can be avoided even though the battery 10 is degraded.

(Configuration of Battery)

Figure 8:
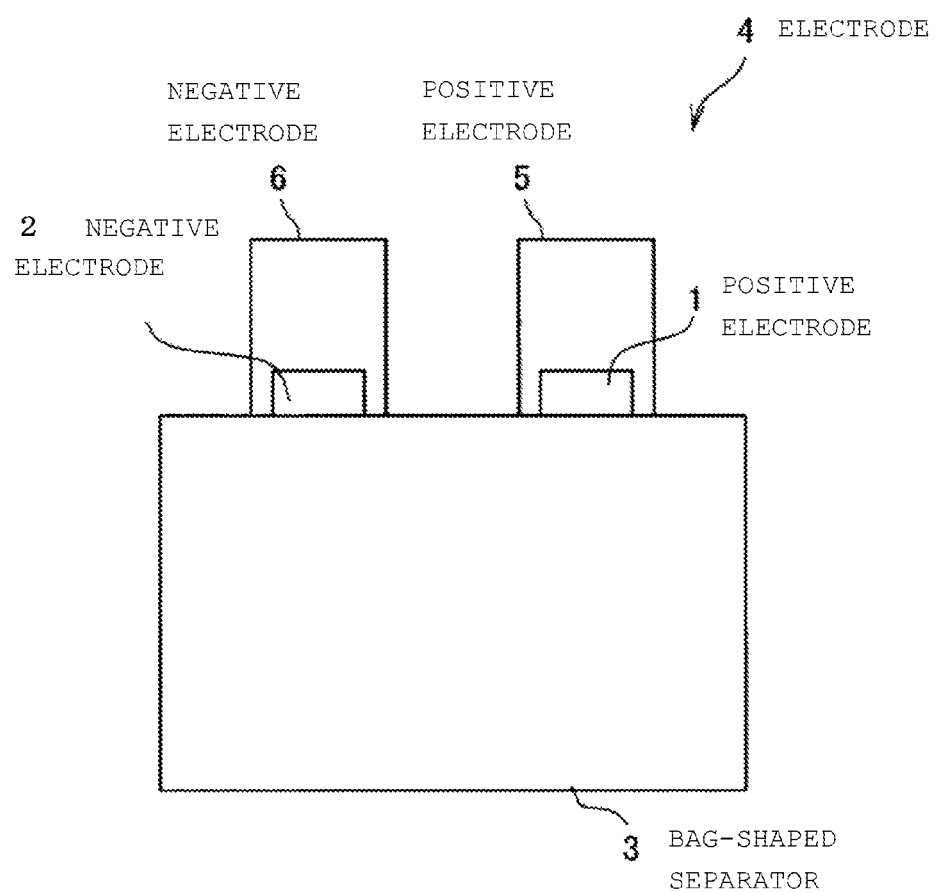
FIG. 8 is a diagram illustrating a configuration example of an electrode body configuring a battery.
Figure 9:
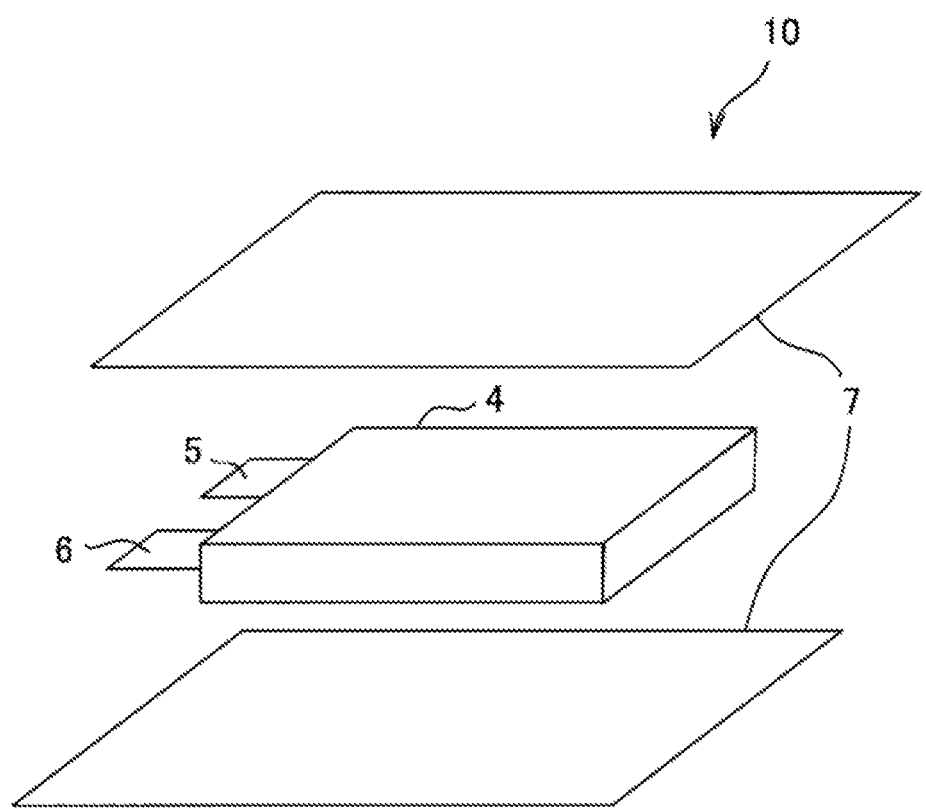
FIG. 9 is a diagram illustrating an aspect where an electrode body is interposed between sheets.
Figures 10, 11:
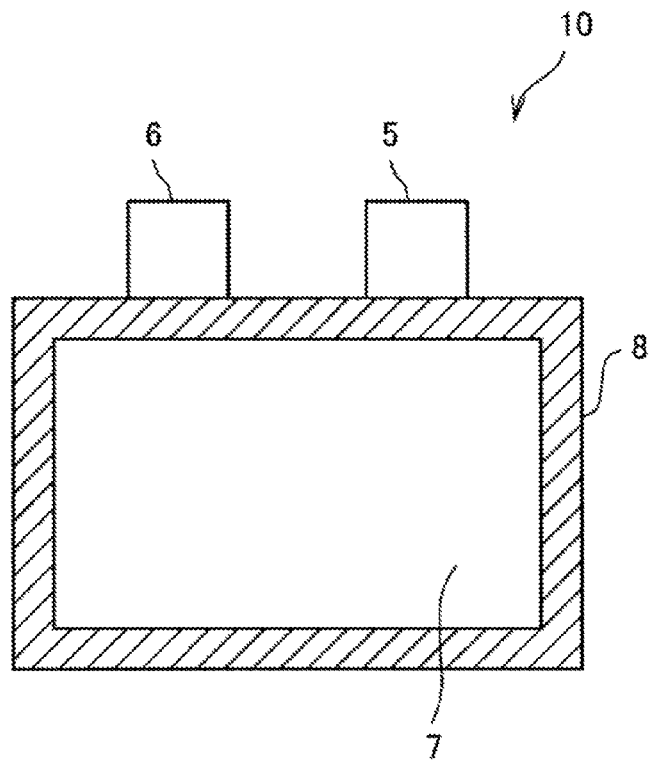
FIG. 10 is a diagram illustrating an aspect where sheets are thermally welded.
FIG. 11 is a table illustrating a cycle test result.

Next, a configuration of the battery 10 will be described with reference to FIGS. 8 to 10. Hereinafter, a configuration example of the battery 10 using a rocking chair type lithium ion secondary battery will be described. FIG. 8 is a diagram illustrating a configuration example of an electrode body 4 configuring the battery 10. FIG. 9 is a diagram illustrating an aspect where the electrode body 4 is interposed between sheets 7. FIG. 10 is a diagram illustrating an aspect where the sheets 7 are thermally welded.

As illustrated in FIG. 8, the electrode body 4 has a positive electrode 1, a negative electrode 2, and a bag-shaped separator 3. The positive electrode 1 is connected to a positive electrode terminal 5 and the negative electrode 2 is connected to a negative electrode terminal 6.

For the positive electrode 1, a resultant obtained by mixing N-methyl pyrrolidone (NMP) as a solvent such that a layered LiMO2 (M shows Ni0.5 Co0.2 Mn0.3) functioning as a positive electrode active material, acetylene black functioning as a conductive material, and polyvinylidene fluoride (PVdF) functioning as a binder become a ratio of weight of 93:4:3 is used as positive electrode mixture slurry. After the positive electrode mixture slurry is coated on an aluminum foil having a thickness of 15 µm and is dried in the atmosphere, a resultant is molded with a size of 45 mm×70 mm by a roll press and is cut in a shape including a current collection foil exposure portion. In this way, the positive electrode 1 is manufactured.

For the negative electrode 2, a resultant obtained by mixing water as a solvent such that graphite, SiO, carboxymethyl cellulose (CMC) functioning as a binder, and styrene butadiene rubber (SBR) become a ratio of weight of 93:5:1:1 is used as negative electrode mixture slurry. After the negative electrode mixture slurry is coated on a copper foil having a thickness of 10 µm and is dried in the atmosphere, a resultant is molded with a size of 45 mm×70 mm by a roll press and is cut in a shape including a current collection foil exposure portion. In this way, the negative electrode 2 is manufactured.

As the separator 3, film materials in which polypropylene, polyethylene, and polypropylene are stacked in three layers and a total thickness is 0.03 mm are used. Two film materials are used, the positive electrode 1 is interposed between the film materials, surrounding three sides are thermally welded to make a bag shape, and the separator 3 is manufactured.

In a state in which the positive electrode 1 and the negative electrode 2 are inserted into the bag-shaped separator 3 and the current collection foil exposure portions are exposed to the outside of the separator 3, the positive electrode terminal 5 and the negative electrode terminal 6 are connected by ultrasonic welding, so that the electrode body 4 illustrated in FIG. 8 is manufactured.

Next, as illustrated in FIG. 9, the electrode body 4 is arranged between the two sheets 7 to be thermally welded and is interposed between the sheets 7. In this state, as illustrated in FIG. 10, the two sheets 7 are thermally welded in a thermal welding portion 8, except for a pouring hole (not illustrated in the drawings) to pour an electrolyte. After the electrolyte is poured from the pouring hole, the pouring hole is sealed by thermal welding.

As the electrolyte of the battery 10, an organic solvent obtained by mixing ethylene carbonate (EC), ethyl methyl carbonate (EMC), and dimethyl carbonate (DMC) to become a volume ratio of 1:2:2 is used. A resultant by dissolving lithium hexafluorophosphate (LiPF6) in the organic solvent to become 1.0 mol/L is used as the electrolyte of the battery 10.

After the electrolyte is poured and the pouring hole is sealed, an electrolyte impregnation time of 8 hours is set. Then, the battery 10 is finished by performing 3 cycle discharge/discharge by a current value of 0.2 CA, in a voltage range of 4.2 V to 2.5 V.

(Cycle Test)

Next, a result obtained by executing a cycle test of the battery 10 by the configuration illustrated in FIG. 1 using the battery 10 manufactured as described above will be described. When the cycle test is executed, values of the battery capacity and the internal resistance in the initial state are measured previously as characteristic data of the battery 10 before the degradation and a charge/discharge curve when the battery 10 is charged/discharged with 0.02 CA is acquired.

The used SOC range of the battery 10 is set as 25% to 75% and the charge/discharge is repeated until a capacity retention rate of the battery 10 decreases to about 80%, so that the cycle test is executed. FIG. 11 is a table illustrating a cycle test result. In FIG. 11, a cycle test result when the voltage range of the charge/discharge is changed two times according to the degradation state of the battery 10 during the cycle test is shown as a first example and a cycle test result when the voltage range is changed once is shown as a second example. In addition, a cycle test result when the voltage range of the charge/discharge is not changed is shown as a first comparative example.

As illustrated in FIG. 11, in the first comparative example in which the voltage range of the charge/discharge is not changed, 4000 charge/discharge cycles are executed until the cycle test ends and in the first and second examples, 5000 and 4500 charge/discharge cycles are executed, respectively. In addition, if an integration capacity in the first comparative example, that is, an integration value of the discharge capacity during the cycle test is set as 1, in both the first and second examples, an integration capacity of 1.1 times is obtained. In other words, from the cycle test results, it can be seen that the voltage range for the charge/discharge of the battery 10 is changed according to the degradation state thereof, using the charge/discharge control method according to the present invention, so that a cycle characteristic of the battery 10 can be effectively improved.

FIG. 12 is a table illustrating the details of the cycle test result according to the first example. As illustrated in FIG. 12, in the first example, when the charge/discharge cycle numbers are 2000 and 4000, it is determined that the battery 10 is in the degradation state, so that the SOC is recalculated and the voltage range of the charge/discharge is changed. As a result, SiO to be the negative electrode active material contributes to the charge/discharge reaction in the negative electrode, so that the degradation of the battery 10 is suppressed, and 5000 charge/discharge cycles can be executed until the capacity retention rate of the battery 10 decreases to about 80%.

FIG. 13 is a table illustrating the details of the cycle test result according to the second example. As illustrated in FIG. 13, in the second example, when the charge/discharge cycle number is 3000, it is determined that the battery 10 is in the degradation state, so that the SOC is recalculated and the voltage range of the charge/discharge is changed. As a result, SiO to be the negative electrode active material contributes to the charge/discharge reaction in the negative electrode, so that the degradation of the battery 10 is suppressed, and 4500 charge/discharge cycles can be executed until the capacity retention rate of the battery 10 decreases to about 80%.

FIG. 14 is a table illustrating the details of the cycle test result according to the first comparative example. As illustrated in FIG. 14, in the first comparative example, the charge/discharge of the battery 10 is continuously performed without changing the voltage range of the charge/discharge. As a result, the discharge/discharge cycle number until the capacity retention rate of the battery 10 decreases to about 80% is 4000 smaller than the discharge/discharge cycle numbers of the first and second examples.

According to one embodiment of the present invention described above, the following functions and effects can be achieved.

(1) The charge/discharge control device 100 controls the charge/discharge of the battery 10 that has SiO to be the negative electrode active material. The charge/discharge control device 100 includes the battery information acquisition unit 12 that acquires the battery information regarding the charge/discharge state of the battery 10, the degradation state determination unit 13 that determines the degradation state of the battery 10, on the basis of the battery information acquired by the battery information acquisition unit 12, and the voltage range change unit 14 that changes the voltage range for the charge/discharge of the battery 10, on the basis of the determination result of the degradation state by the degradation state determination unit 13. Therefore, the cycle characteristic of the battery 10 can be effectively improved.

(2) The degradation state determination unit 13 calculates the Q-dV/dQ curve showing the relation of the discharge capacity Q of the battery 10 and dV/dQ showing the ratio of the change amount dV of the battery voltage V to the change amount dQ of the discharge capacity Q, on the basis of the battery information acquired by the battery information acquisition unit 12 (step S102), and determines the degradation state of the battery 10, on the basis of the Q-dV/dQ curve (step S103). Therefore, the degradation state of the battery 10 can be determined accurately.

(3) The voltage range change unit 14 executes the SOC recalculation to recalculate the relation of the discharge capacity Q of the battery 10 and the state of charge (SOC) of the battery 10, on the basis of the determination result of the degradation state by the degradation state determination unit 13 (step S104), and changes the voltage range for the charge/discharge of the battery 10, on the basis of the result of the SOC recalculation (step S105). Therefore, the voltage range for the charge/discharge of the battery 10 can be appropriately changed according to the degradation state of the battery 10.

In the embodiment described above, the Q-dV/dQ curve is calculated on the basis of the acquired battery information, it is determined whether the specific singular point is included in the charge/discharge range of the battery 10 in the Q-dV/dQ curve, and the degradation state of the battery 10 is determined. However, the degradation state of the battery 10 may be determined by other method. For example, a position relation of the individual singular points in the Q-dV/dQ curve is calculated and the degradation state of the battery 10 can be determined from the position relation. The degradation state of the battery 10 can be determined by various methods, according to the kind of the active material or the electrode material used in the battery 10.

In addition, the configuration of the lithium ion battery controlled in the charge/discharge control method and the charge/discharge control device according to the present invention is not limited to the configuration described in the embodiment. A specific configuration of a battery that includes a positive electrode capable of storing/discharging lithium ions, a negative electrode capable of storing/discharging the lithium ions, and lithium salt is not limited in particular. For example, a battery using a nonaqueous electrolyte and a battery including a lithium ion polymer may be used. In addition, a battery including a solid electrolyte and a battery including an ion liquid may be used. The separator is not an essential configuration and may be used if necessary.

The embodiments and the modifications described above are only exemplary and the present invention is not limited to the above content, as long as a characteristic of the invention is not deteriorated.

REFERENCE SIGNS LIST

1 positive electrode
2 negative electrode
3 separator
4 electrode body
5 positive electrode terminal
6 negative electrode terminal
7 sheet
8 thermal welding portion
10 lithium ion battery
11 controller
12 battery information acquisition unit
13 degradation state determination unit
14 voltage range change unit
15 control signal transmission unit
100 charge/discharge control device

The invention claimed is:

1. A charge/discharge control method for a lithium ion battery having a negative electrode active material, the lithium ion battery being connected to a charge/discharge control device, the method comprising:

acquiring battery information regarding a charge/discharge state of the lithium ion battery by the charge/discharge control device;

calculating a Q-dV/dQ curve showing a relationship of discharge capacity Q of the lithium ion battery and dV/dQ, which shows a ratio of a change amount dV of a battery voltage V to a change amount dQ of the discharge capacity Q on the basis of the battery information, by the charge/discharge control device;

determining a degradation state of the lithium ion battery on the basis of the information-dV/dQ curve, by the charge/discharge control device; and changing a voltage range for charge/discharge of the lithium ion battery on the basis of a determination result of the degradation state, by the charge/discharge control device;

wherein SOC recalculation to recalculate a relationship of the discharge capacity Q of the lithium ion battery and a state of charge SOC of the lithium ion battery is executed on the basis of the determination result of the degradation state, by the charge/discharge control device, and the voltage range is changed on the basis of a result of the SOC recalculation, by the charge/discharge control device.

2. A charge/discharge control device for controlling charge/discharge of a lithium ion battery having a negative electrode active material, comprising:

a battery information acquisition unit which acquires battery information regarding a charge/discharge state of the lithium ion battery;

a degradation state determination unit which determines a degradation state of the lithium ion battery, on the basis of the battery information acquired by the battery information acquisition unit; and a voltage range change unit which changes a voltage range for charge/discharge of the lithium ion battery, on the basis of a determination result of the degradation state by the degradation state determination unit wherein the degradation state determination unit calculates a Q-dV/dQ curve showing a relationship of discharge capacity Q of the lithium ion battery and dV/dQ, which shows a ratio of a change amount dV of a battery voltage V to a change amount dQ of the discharge capacity Q, on the basis of the battery information, and determines the degradation state of the lithium ion battery, on the basis of the Q-dV/dQ curve; and wherein the voltage range change unit executes SOC recalculation to recalculate a relation of the discharge capacity Q of the lithium ion battery and a state of charge SOC of the lithium ion battery, on the basis of the determination result of the degradation state, and changes the voltage range, on the basis of a result of the SOC recalculation.

* * * * *